United States Patent
Nakagaki (10) Patent No.: US 7,202,742 B2
(45) Date of Patent: Apr. 10, 2007

(54) DIGITAL AMPLIFICATION DEVICE

(75) Inventor: Toshiya Nakagaki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 161 days.

(21) Appl. No.: 10/504,214

(22) PCT Filed: Jul. 25, 2003

(86) PCT No.: PCT/JP03/09442

§ 371 (c)(1),
(2), (4) Date: Aug. 11, 2004

(87) PCT Pub. No.: WO2004/019487

PCT Pub. Date: Mar. 4, 2004

(65) Prior Publication Data

US 2005/0113055 A1    May 26, 2005

(30) Foreign Application Priority Data

Aug. 22, 2002  (JP) ............................. 2002-241425

(51) Int. Cl.
*H03G 3/00*  (2006.01)
*H03F 1/36*  (2006.01)

(52) U.S. Cl. ...................... 330/278; 330/102
(58) Field of Classification Search .................. 330/10, 330/251, 207 A, 102, 278
See application file for complete search history.

(56) References Cited

U.S. PATENT DOCUMENTS

| | | | |
|---|---|---|---|
| 4,092,610 A * | 5/1978 | White et al. ............. 330/207 A |
| 5,410,592 A * | 4/1995 | Wagner et al. ......... 379/388.03 |
| 5,721,490 A | 2/1998 | Takano et al. |
| 6,476,674 B2 * | 11/2002 | Smedegaard-Pedersen et al. ............................ 330/251 |
| 6,552,606 B1 * | 4/2003 | Veltman et al. ................ 330/10 |
| 6,563,377 B2 * | 5/2003 | Butler .......................... 330/10 |

FOREIGN PATENT DOCUMENTS

| | | |
|---|---|---|
| JP | 62-144411 | 6/1987 |
| JP | 4-159803 | 6/1992 |
| JP | 7-131272 | 5/1995 |
| JP | 2000-307359 | 11/2000 |
| WO | WO 00/42702 | 7/2000 |

OTHER PUBLICATIONS

International Search Report corresponding to application No. PCT/JP03/09442 dated Nov. 18, 2003.
European Search Report corresponding to application No. EP 03-79-2637 dated Feb. 4, 2005.

* cited by examiner

*Primary Examiner*—Patricia Nguyen
(74) *Attorney, Agent, or Firm*—RatnerPrestia (57) ABSTRACT

A digital amplification device has a digital amplifying unit, a low-pass filter for integrating a digital signal, and a current feedback circuit that is transformer-coupled to the low-pass filter and feeds back current to the differential input terminal. A signal related to distortion is fed back and the distortion is reduced.

6 Claims, 5 Drawing Sheets

FIG. 6

DIGITAL AMPLIFICATION DEVICE

THIS APPLICATION IS A U.S. NATIONAL PHASE APPLICATION OF PCT INTERNATIONAL APPLICATION PCT/JP03/09442.

TECHNICAL FIELD

The present invention relates to reduction of distortion of a digital amplification device, especially to a digital amplification device used in a car audio equipment.

BACKGROUND ART

A conventional digital amplification device designed in consideration of reduction of coil distortion of a low-pass filter is disclosed in Japanese Laid-open Patent No. 2000-307359.

Figure 6:
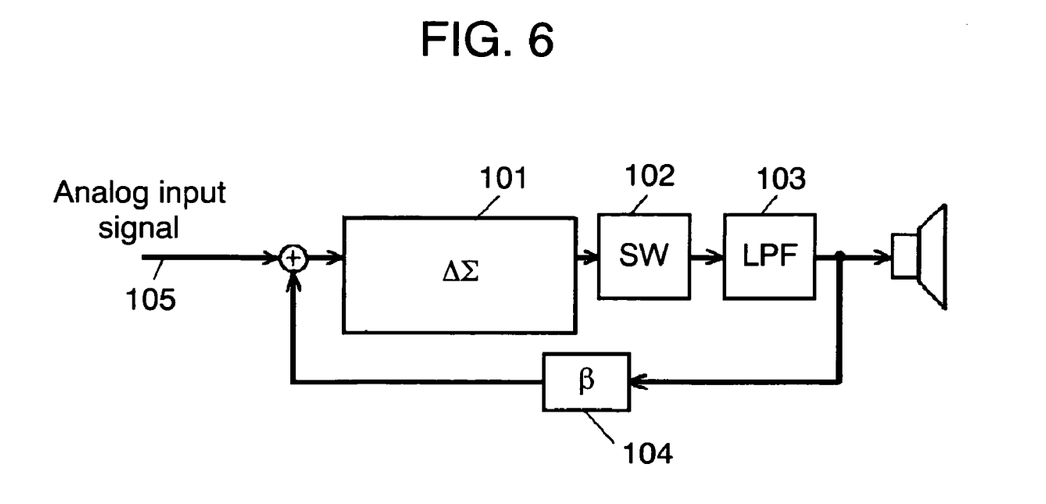
FIG. 6 is a circuit block diagram of a conventional digital amplification device.

FIG. 6 is a circuit block diagram of the conventional digital amplification device. ΔΣ modulator (ΔΣ in FIG. 6) 101 converts analog input signal 105 into a pulse density modulation signal. Constant-voltage switch (SW in FIG. 6) 102 is formed of a switch element having a small on-resistance such as a metal-oxide semiconductor field-effect transistor (MOSFET), and power-amplifies an output signal of ΔΣ modulator 101. Low-pass filter (LPF in FIG. 6) 103 is formed of a coil and a capacitor. Cut-off frequency of low-pass filter 103 is set lower than the switching frequency of constant-voltage switch 102. The switching component included in an output signal of constant-voltage switch 102 is attenuated, and a power output of constant-voltage switch 102 is smoothed and demodulated to an analog output signal. Feedback circuit (β in FIG. 6) 104 feeds back an output of low-pass filter 103 to an input of ΔΣ modulator 101. In this configuration, a distortion occurring in low-pass filter 103 is detected based on the output voltage, and is fed back as a negative phase component to the input part to improve the distortion factor.

Distortion of a coil used in the low-pass filter also causes a problem about sound quality. The digital amplification device requires a low-pass filter for integrating pulse signals, but especially coil distortion at a high magnitude output is a large factor of degradation of the sound quality. This distortion is caused by a nonlinear characteristic of a B-H curve of a magnetic material used for the coil, and is current distortion generated by current. The larger the current is, the greater the effect of the nonlinear characteristic is.

Especially, a car audio equipment is often operated by a 12V system as a power source for an automobile, so that a high power output must be obtained by low power source voltage. For this purpose, a method of decreasing impedance of a speaker as a load is used. When the impedance of the load is decreased, however, current of the load increases and hence the distortion of the coil of the low-pass filter in the digital amplification device further increases to degrade the sound quality.

For decreasing the distortion factor of low-pass filter 103 in the digital amplification device, a means for detecting output current is useful. When only a resistor works as a load, the output voltage is proportional to the output current, and therefore the distortion of the coil can be accurately reduced by detecting the output voltage. When a nonlinear load such as a speaker is used, however, the output current can largely distorts even if the output voltage does not distort. It is difficult to correct this distortion by detecting the output voltage.

For increasing the output efficiency, an on-resistance of a switching transistor and a resistance component of an output circuit must be minimized. Here, the switching transistor constitutes the output part of a digital amplifying stage, and the resistance component is, for example, a resistance component of the coil in low-pass filter 3. Therefore, it is not preferable to dispose a resistor or the like in an output circuit in series.

DISCLOSURE OF THE INVENTION

A digital amplification device has the following elements:
a digital amplifying unit including a differential input terminal for inputting an analog signal and a differential output terminal for outputting a digital signal, converting the analog signal to the digital signal, amplifying the power, and outputting the digital signal;
a low-pass filter for integrating the digital signal; and
a load output terminal for outputting a signal from the low-pass filter,
Wherein the digital amplification device further comprises a current feedback circuit for feeding back, to the differential input terminal, a signal related to a signal provided by transformer coupling with the low-pass filter.

DETAILED DESCRIPTION OF PREFERRED EMBODIMENTS

The present invention provides digital amplification devices for addressing the problems of the conventional digital amplification device.

The digital amplification devices in accordance with exemplary embodiments of the present invention are described with reference to the drawings.

(Exemplary Embodiment 1)

Figure 1:
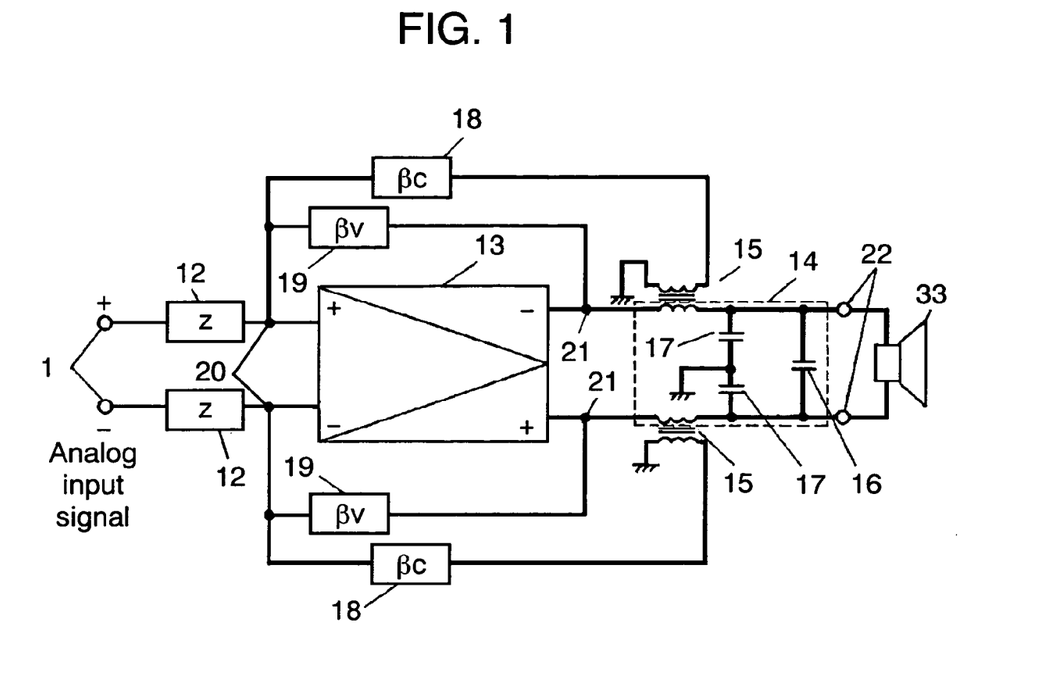
FIG. 1 is a circuit block diagram of a digital amplification device in accordance with exemplary embodiment 1 of the present invention.

FIG. 1 is a circuit block diagram of a digital amplification device in accordance with exemplary embodiment 1 of the present invention.

Analog input terminal 11 is connected to differential input terminal 20 of digital amplifying unit 13 through input impedance element 12 (Z in FIG. 1). Differential output terminal 21 of digital amplifying unit 13 is connected to load output terminal 22 through low-pass filter 14. Low-pass filter 14 has first transformer-coupling-type coil 15, capacitor 16 interposed between first transformer coupling type coil 15 and load output terminal 22, and bypass capacitor 17 interposed between load output terminal 22 and the ground. A primary side coil of first transformer coupling type coil 15 is interposed between differential output terminal 21 and load output terminal 22 in series. One end of a secondary coil of first transformer coupling type coil 15 is grounded, and the other end is connected to differential input terminal 20 through first current feedback circuit ($\beta$C in FIG. 1) 18. Differential input terminal 20 is also connected to differential output terminal 21 through voltage feedback circuit ($\beta$V in FIG. 1) 19.

Operations of the digital amplification device are described hereinafter.

An analog audio input signal given to analog input terminal 11 is fed to differential input terminal 20 of digital amplifying unit 13 through a pair of input impedance elements 12. This analog signal is converted to a digital pulse width modulation (PWM) signal having a frequency sufficiently higher than that of the analog audio signal and amplified in power by digital amplifying unit 13. The amplified PWM signal is fed from differential output terminal 21 to low-pass filter 14. The PWM signal is integrated by low-pass filter 14, is supplied to speaker 33 through load output terminal 22, and is reproduced as a sound. Voltage of the digital signal supplied from differential output terminal 21 of digital amplifying unit 13 is fed back to differential input terminal 20 through voltage feedback circuit 19. Current of the digital signal is fed back from the secondary coil of first transformer coupling type coil 15 to differential input terminal 20 through first current feedback circuit 18. Here, the first transformer coupling type coil 15 is a component of low-pass filter 14.

Figure 2:
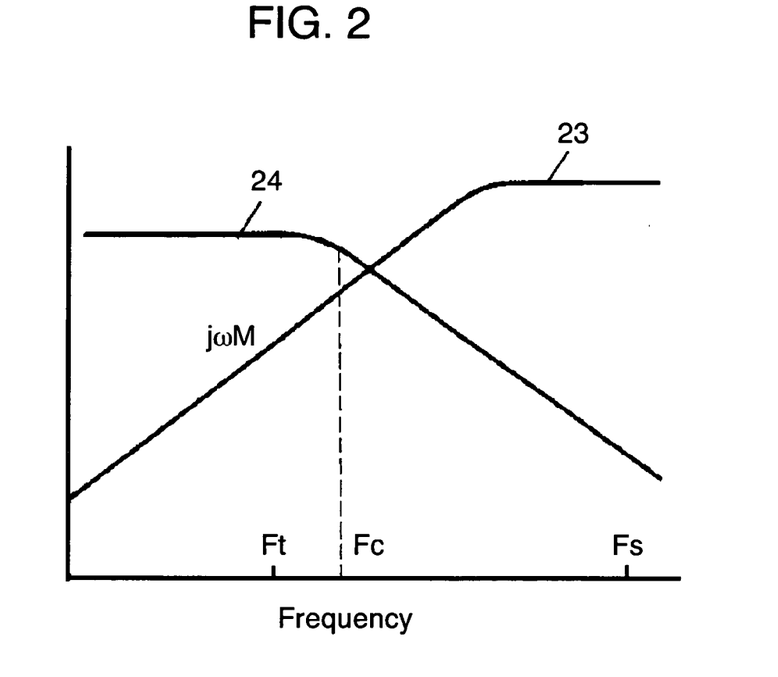
FIG. 2 is a transfer characteristic diagram of a first current feedback circuit of the digital amplification device in accordance with exemplary embodiment 1.

FIG. 2 is a transfer characteristic diagram of first current feedback circuit 18. In FIG. 2, curve 23 shows a voltage characteristic induced in the secondary coil of first transformer coupling type coil 15 having a gradient of coupling coefficient M, and curve 24 shows a transfer characteristic of first current feedback circuit 18.

In first current feedback circuit 18, a switching frequency component as distortion must be attenuated by making cut-off frequency Fc of first current feedback circuit 18 lower than switching frequency Fs of the PWM signal. The loop gain and phase of first current feedback circuit 18 must be adjusted to cancel a distortion component of signal frequency Ft. In other words, third harmonic distortion occurring in first transformer coupling type coil 15 is largest in the digital amplification device. When the transfer characteristic of first current feedback circuit 18 is adjusted so that only third harmonic distortion is fed back, the third harmonic distortion can be largely reduced. In this case, only an error signal as the third harmonic distortion is fed back, so that the feedback gain may be simply inverse number of gain A of digital amplifying unit 13, namely 1/A. Thus, the feedback amount of first current feedback circuit 18 is adjusted to be the largest at a frequency three times higher than signal frequency Ft, namely 3×Ft, thereby efficiently reducing the third harmonic distortion of signal frequency Ft.

Figure 3:
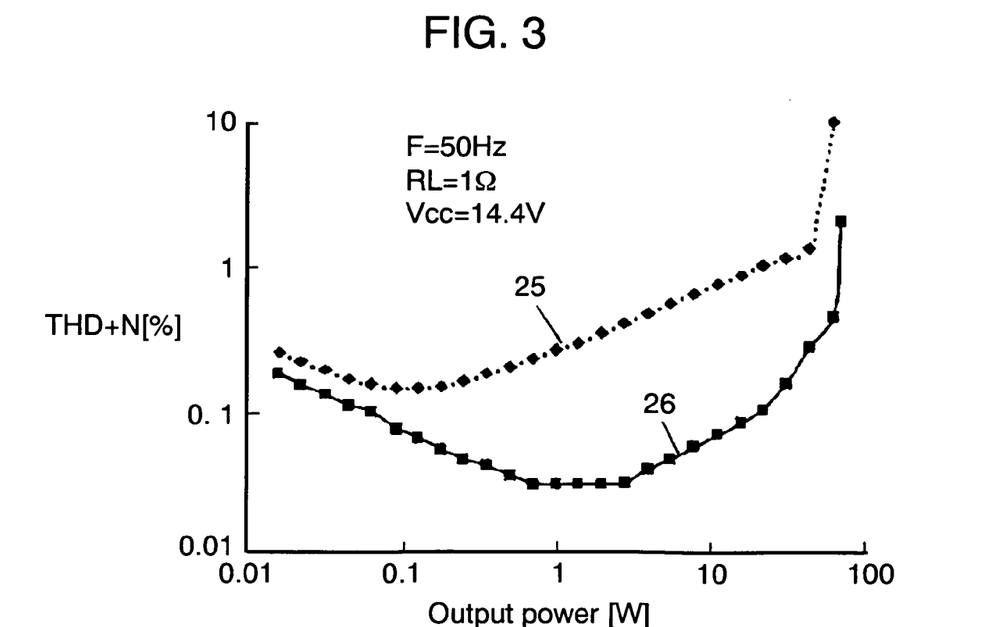
FIG. 3 is a characteristic diagram of total harmonic distortion for output power of the digital amplification device in accordance with exemplary embodiment 1.

FIG. 3 is a characteristic diagram of the total harmonic distortion factor for output power of the digital amplification device in accordance with exemplary embodiment 1. The horizontal axis shows the output power, and the vertical axis shows the total harmonic distortion factor (THD+N in FIG. 3). Polygonal line 25 shows a characteristic when first current feedback circuit 18 is not disposed, and polygonal line 26 shows a characteristic when first current feedback circuit 18 is disposed. When first current feedback circuit 18 with first transformer coupling type coil 15 is disposed, about 20 dB or higher of improvement is recognized at output power of 1 W to 30 W comparing with the conventional digital amplification device.

FIG. 3 shows a characteristic example provided when frequency F of the analog input signal is 50 Hz, output load RL of the digital amplification device is 1 $\Omega$, power source voltage Vcc used for driving the digital amplification device is 14.4 V.

The structure discussed above can reduce distortion of the low-pass filter with the current feedback circuit that detects and feeds back the current distortion causing the distortion of the low-pass filter.

(Exemplary Embodiment 2)

Figure 4:
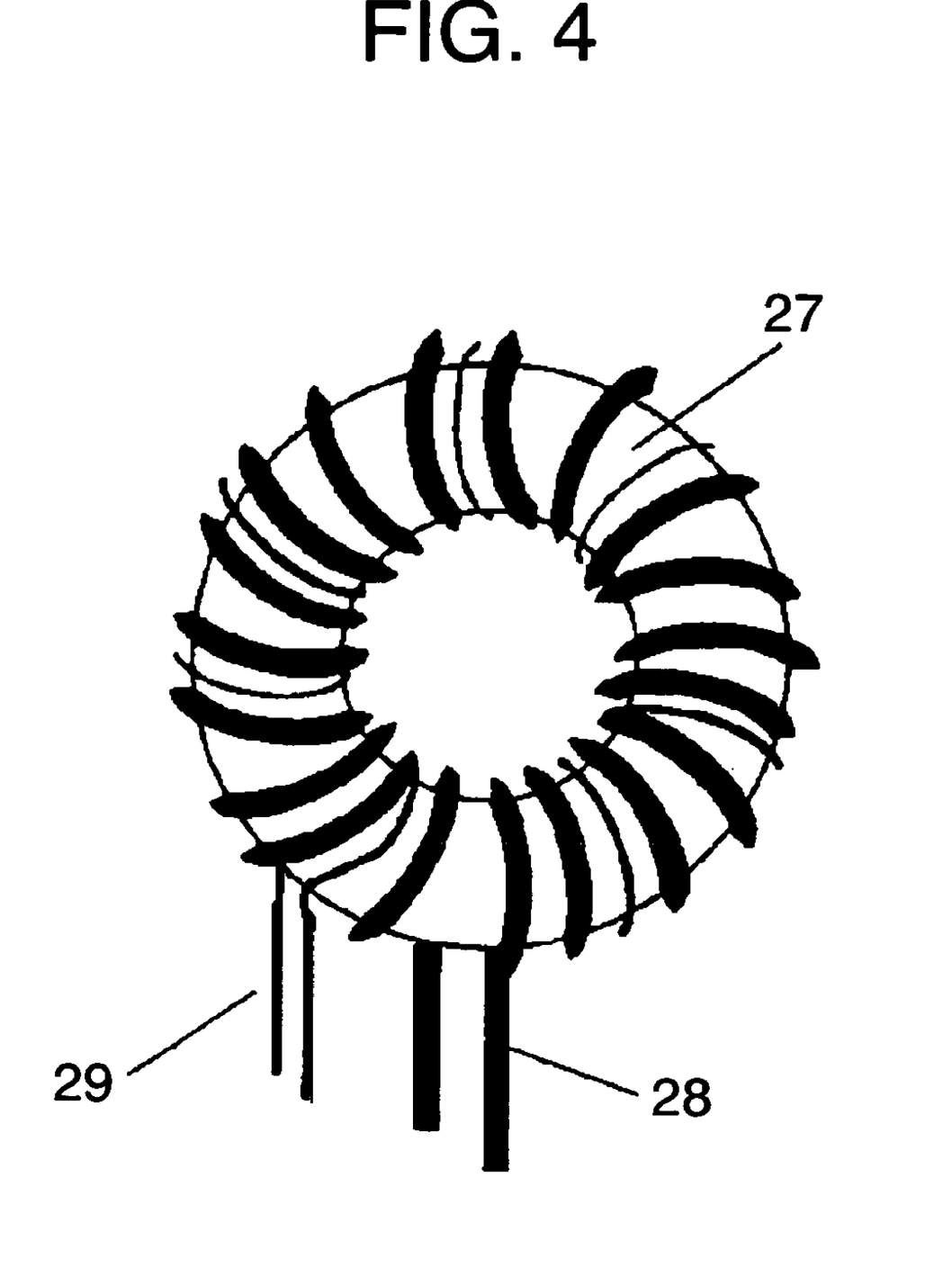
FIG. 4 is a schematic diagram of a first transformer coupling type coil of a digital amplification device in accordance with exemplary embodiment 2 of the present invention.

FIG. 4 is a schematic diagram of first transformer coupling type coil 15 of a digital amplification device in accordance with exemplary embodiment 2 of the present invention. FIG. 4 shows the first transformer coupling type coil formed of a toroidal double winding. The resistance component of first transformer coupling type coil 15 causes a loss and hence must be decreased. The resistance component is proportional to the number of turns of the coil winding, so that it is required to provide a desired inductance with small number of turns. It is therefore preferable to employ a core material having high magnetic permeability.

However, a material having high magnetic permeability has generally a B-H curve with high nonlinearity. The object of the present embodiment is to compensate the nonlinearity of the B-H curve, but it is not preferable that the B-H curve has extreme nonlinearity. Toroidal core 27 having a B-H curve with good linearity is used.

The number of turns of primary winding 28 is set so as to provide the inductance of low-pass filter 14. For decreasing the resistance component, winding as thick as possible is preferably used if a predetermined number of turns can be obtained.

Secondary winding 29 may be thin. The number of turns of secondary winding 29 can be determined substantially arbitrarily keeping a balance between the number and the transfer characteristic of first current feedback circuit 18. However, the number of turns is preferably a few or more so as to stabilize coupling coefficient M. Fixing the winding with an adhesive also stabilizes coupling coefficient M.

A toroidal coil often used in the conventional digital amplification device is employed in the structure discussed above, so that a printed board pattern substantially similar to the conventional art can be used. Additionally, a pattern taking measures against radiation noise can be employed and the structure of the conventional digital amplification device can be used with little change, so that current can be detected at low cost.

(Exemplary Embodiment 3)

Figure 5:
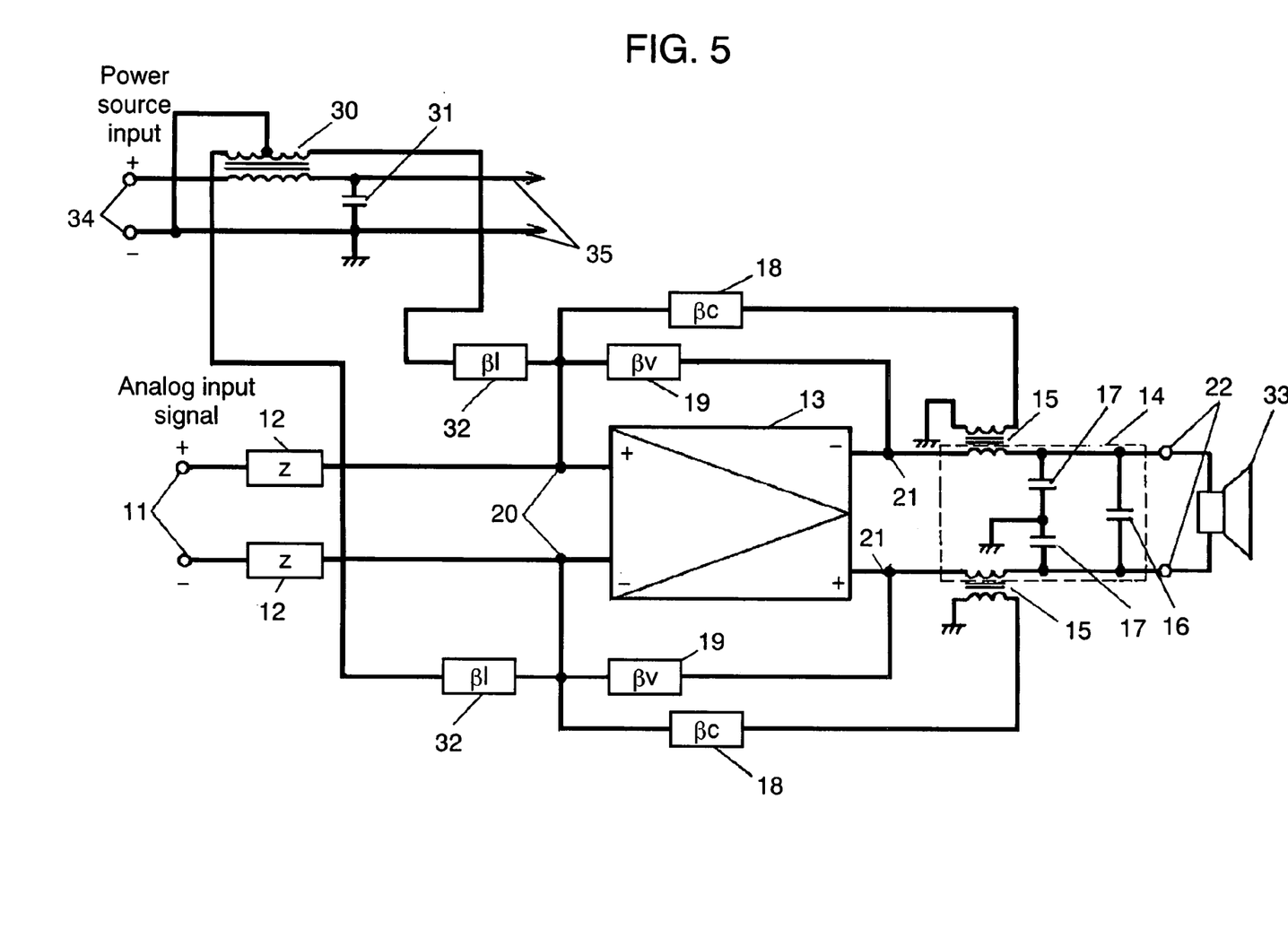
FIG. 5 is a circuit block diagram of a digital amplification device in accordance with exemplary embodiment 3 of the present invention.

FIG. 5 is a circuit block diagram of a digital amplification device in accordance with exemplary embodiment 3 of the present invention. In FIG. 5, part of the digital amplification device different from that of exemplary embodiment 1 is mainly described hereinafter.

Second transformer-coupling-type coil 30 is one component of a line filter of a power source input part, the primary coil constitutes an inductance component of the line filter, and the resistance component is preferably small. The secondary coil electromagnetically connected to the primary coil is formed of two coils, these coils have substantially the same number of turns and reverse polarization, and one end of each coil is grounded.

Capacitor 31 forms a capacitance component of the line filter, and is connected to the output side of the primary coil of second transformer coupling type coil 30. For supplying current having small fluctuation to digital amplifying unit 13, it is preferable to set capacity of capacitor 31 to be sufficiently large.

An external power is given to power-source input terminal 34, is passed through the primary coil of second transformer coupling type coil 30, and is supplied as power-source 35 to digital amplifying unit 13. Current is thus supplied to digital amplifying unit 13.

A pair of second current feedback circuits (β1 in FIG. 5) 32 are connected to respective non-grounded terminals of the secondary coil of second transformer coupling type coil 30. Polarity and gain of second current feedback circuits 32 are set to cancel ripple voltage of the power source circuit. Only for adjusting the gain, second current feedback circuits 32 can be formed of only a resistor. However, switching waveform is generally superimposed on the power source, so that the second current feedback circuits 32 may be formed of low-pass filters having cut-off frequency not lower than a reproduced audio frequency band.

Operations of the digital amplification device are described hereinafter.

A power source line supplied from power-source input terminal 34 to digital amplifying unit 13 has small yet some impedance, so that ripple current occurs in the power source line. This power source provides a reference voltage of digital amplifying unit 13, so that the ripple current becomes a distortion component of the output as it is. Therefore, second transformer coupling type coil 30 detects current distortion, assumes it as ripple current of the power source, and adds it to the input signal. At this time, second current feedback circuits 32 adjust a correction amount, and therefore the distortion component caused by the ripple current of the power source can be cancelled in the output voltage from digital amplifying unit 13.

When impedance such as a resistor is disposed in the power source line, the impedance causes a loss to decrease efficiency. However, detecting the distortion current with second transformer coupling type coil 30 can realize the cancellation of the distortion component without increasing the resistor component.

In the structure described above, by detecting the distortion current with second transformer coupling type coil 30, the ripple current of the power source can be detected as the distortion current without increasing the impedance of the power source line. Feeding back the distortion current can reduce the distortion caused by the impedance of the power source line.

As discussed in embodiment 1 to embodiment 3, the digital amplification device of the present invention has the first current feedback circuit that detects and feeds back the current distortion causing the distortion in the low-pass filter, so that the distortion of the low-pass filter can be reduced.

The digital amplification device of the present invention also has the voltage feedback circuit for feeding back voltage of a digital signal fed from the differential output terminal to the differential input terminal, so that both current and voltage can be fed back and the distortion of the low-pass filter can be further reduced.

The digital amplification device of the present invention has a low-pass filter formed of a toroidal double winding and a capacitor, so that it can go into actual use with little change from the structure of the conventional digital amplification device. The current can therefore be detected at low cost, and the distortion can be reduced at low cost.

The digital amplification device of the present invention can reduce distortion of the low-pass filter with the first current feedback circuit that detects and feeds back current distortion causing the distortion in the low-pass filter. By the second current feedback circuit, the digital amplification device can also reduce distortion caused by the impedance of the power source circuit.

Thus, the digital amplification device of the present invention has a current feedback circuit that is transformer-coupled to the low-pass filter and feeds back current to the differential input terminal. The current feedback circuit detects and feeds back the current distortion causing distortion of the low-pass filter, thereby reducing the distortion of the low-pass filter.

INDUSTRIAL APPLICABILITY

A digital amplification device of the present invention can reduce distortion of a low-pass filter by current feedback. The digital amplification device of the present invention can also reduce distortion caused by the impedance of the power source circuit by current feedback from a power source circuit.

The invention claimed is:

1. A digital amplification device comprising:
   a differential input terminal for inputting an analog signal, the differential input terminal including a first input terminal and a second input terminal;
   a digital amplifying unit for converting the analog signal to the digital signal, amplifying the power, and outputting the digital signal to a differential output terminal that includes a first output terminal and a second output terminal;
   a low-pass filter for integrating the digital signal; and
   a load output terminal for outputting a signal from the low-pass filter,
   wherein
   the digital amplification device further comprises:
     a first current feedback circuit one end of which is coupled to another end of a secondary coil of a first transformer coupling coil, and the other end of which is coupled to the first input terminal, and a second current feedback circuit one end of which is coupled to another end of a secondary coil of a second transformer coupling coil, and the other end of which is coupled to the second input terminal; and
     a first voltage feedback circuit for feeding back voltage between the first output terminal and the first input terminal and a second voltage feedback circuit for feeding back voltage between the second output terminal and the second input terminal,
     wherein at least the first voltage feedback circuit is directly connected to the first current feedback circuit or the second voltage feedback circuit is directly connected to the second current feedback circuit.

2. A digital amplification device according to claim 1, wherein the first transformer coupling coil and the second transformer coupling coil includes a toroidal double winding.

3. A digital amplification device according to claim 1, further comprising:
   a second transformer coupling type coil having a primary coil and a secondary coil formed of two windings, the windings being wound In the mutually reverse directions; and
   a third current feedback circuit,
   wherein, the primary coil of the second transformers coupling coil is disposed so as to provide an inductance component of a line filter of a power source input and supplies power source to the digital amplifying unit;

wherein one side terminals of the windings are grounded and the other side terminals of the windings are coupled to the third current feedback circuit; and wherein the third current feedback circuit feeds back a signal related to a signal from the windings to the differential input terminal.

4. A digital amplification device according to claim 1, wherein the load output terminal includes a first load output terminal and a second load output terminal;

the low-pass filter includes a first low-pass filter for integrating the output of the first output terminal and outputting the integrated output at the first load output terminal, and a second low-pass filter for integrating the output of the second output terminal and outputting the integrated output at the second load output terminal;

the first low-pass filter includes a primary coil of a first transformer coupling coil coupled between the first output terminal and the first load output terminal, and a first capacitor, one end of which is coupled to the first load output terminal and the other end of which is grounded;

the second low-pass filter includes a primary coil of a second transformer coupling coil coupled between the second output terminal and the second load output terminal, and a second capacitor one end of which is coupled to the second load output terminal and the other end of which is grounded; and one end of a secondary coil of the first and second transformer coupling coils is grounded.

5. A digital amplification device according to claim 1, wherein the first voltage feedback circuit is coupled to the first current feedback circuit so that the output of the first voltage feedback circuit and the output of the first current feedback circuit are both received at the first input terminal.

6. A digital amplification device according to claim 1, wherein the second voltage feedback circuit is coupled to the second current feedback circuit so that the output of the second voltage feedback circuit and the output of the second current feedback circuit are, both received at the second input terminal.

* * * * *

UNITED STATES PATENT AND TRADEMARK OFFICE
CERTIFICATE OF CORRECTION

PATENT NO. : 7,202,742 B2
APPLICATION NO. : 10/504214
DATED : April 10, 2007
INVENTOR(S) : Toshiya Nakagaki It is certified that error appears in the above-identified patent and that said Letters Patent is hereby corrected as shown below:

Title Page, Item (56) References Cited, FOREIGN PATENT DOCUMENTS
Change "WO    WO 00/42702    7/2000"
To -- WO    00/42702    7/2000 --

Column 6
Line 61, change "In" to -- in --

Column 8
Line 18, change "are," to -- are --

Signed and Sealed this

Eighteenth Day of September, 2007

JON W. DUDAS
*Director of the United States Patent and Trademark Office*